United States Patent
Sallander

(10) Patent No.: US 7,085,076 B2
(45) Date of Patent: Aug. 1, 2006

(54) APERTURE STOP ASSEMBLY FOR HIGH POWER LASER BEAMS

(75) Inventor: Jesper Sallander, Bromma (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 11/094,435

(22) Filed: Mar. 31, 2005

(65) Prior Publication Data
US 2005/0219713 A1    Oct. 6, 2005

Related U.S. Application Data

(60) Provisional application No. 60/559,034, filed on Apr. 5, 2004.

(51) Int. Cl.
*G02B 9/00* (2006.01)
*G02B 9/08* (2006.01)

(52) U.S. Cl. .................................................... 359/738

(58) Field of Classification Search ........ 359/738–740; 355/71
See application file for complete search history.

(56) References Cited

U.S. PATENT DOCUMENTS

| | | | | |
|---|---|---|---|---|
| 4,153,368 | A | * | 5/1979 | Falbel et al. ................. 356/225 |
| 4,746,205 | A | * | 5/1988 | Cross et al. ................. 359/739 |
| 6,178,046 | B1 | * | 1/2001 | Broome et al. ............. 359/738 |

* cited by examiner

*Primary Examiner*—Alicia M Harringtion
(74) *Attorney, Agent, or Firm*—Harness, Dickey & Pierce, P.L.C.

(57) ABSTRACT

An aperture stop assembly for use in an electromagnetic radiation system may include an aperture stop made of a material at least partly transparent to an applied electromagnetic radiation. At least a portion of the aperture stop may be formed at an edge of an aperture to deflect electromagnetic radiation into the at least partially transparent material.

18 Claims, 2 Drawing Sheets

APERTURE STOP ASSEMBLY FOR HIGH POWER LASER BEAMS

CROSS-REFERENCE TO RELATED APPLICATIONS

This U.S. non-provisional patent application claims priority under 35 U.S.C. § 120 of U.S. provisional Application 60/559,034, filed on Apr. 5, 2004, the entire contents of which are hereby incorporated by reference.

TECHNICAL FIELD

Example embodiments of the present invention relate to an aperture stop, an aperture stop assembly, a laser, and methods for the same.

BACKGROUND OF THE INVENTION

With conventional light sources, light emitted by the source usually has a lower energy level. In optical lithography or metrology an excimer laser, for example, may be used as a light source, and the radiation output from the laser may be passed through a radiation beam-scrambling illuminator to distribute the light intensity, for example, uniformly over an area. The area may be a spatial light modulation (SLM) area. When using higher power laser beam sources, the energy may heat conventional (e.g., simpler) blocking apertures, which may result in a change in the dimensions and/or form of the blocking aperture. In an alternative, material from a conventional aperture stop may be re-deposited onto other components of the optical system on which the aperture stop may be arranged.

SUMMARY OF THE INVENTION

Example embodiments of the present invention provide an aperture stop, an aperture stop assembly, and a laser, which may be capable of handling higher power laser beams with suppressed (e.g., without) shape and/or dimension variation of the blocking aperture. Example embodiments of the present invention also provide methods for blocking at least a part of a beam of electromagnetic radiation.

Example embodiments of the present invention provide a more compact and/or effective solution capable of handling the power that may be cut off from a laser beam.

In example embodiments of the present invention, an aperture stop assembly may be used in, for example, an electromagnetic radiation system. The aperture stop assembly may include an aperture stop comprised of a material at least partly transparent to an applied electromagnetic radiation. At least a part of an edge (e.g., border) of the aperture stop may be formed to an aperture to deflect the electromagnetic radiation into the material at least partly transparent to the electromagnetic radiation.

Example embodiments of the present invention provide a method for shaping higher power electromagnetic radiation beams, with suppressed (e.g., without) shape and/or dimension variation of the blocking aperture.

Example embodiment of the present invention provide a method for blocking at least a portion (e.g., part) of a beam of electromagnetic radiation. The method may include generating a beam of radiation (e.g., electromagnetic radiation); impinging the beam of radiation onto a beam aperture assembly; blocking at least a portion of the beam of radiation using a material, which may be at least partly transparent to the radiation; defining an aperture stop, by deflecting the portion of the radiation through at least one total internal reflection.

An example embodiment of the present invention provides an aperture stop assembly for use in a system, which may include an aperture stop. The aperture stop may be made of a material at least partially transparent to an applied electromagnetic radiation. At least a portion of a border of the aperture stop may be attached to an aperture to deflect electromagnetic radiation into the at least partially transparent material.

Another example embodiment of the present invention provides a method for blocking at least a part of a beam of electromagnetic radiation. The method may comprise generating a beam of electromagnetic radiation, impinging the beam of electromagnetic radiation onto a beam aperture assembly, blocking at least a portion of the beam of electromagnetic radiation using a material at least partially transparent to the impinging beam of electromagnetic radiation, and defining an aperture stop, by deflecting the portion using at least one total internal reflection.

Another example embodiment of the present invention provides a Fourier filter assembly for use in an electromagnetic radiation system. The assembly may include a Fourier aperture stop. The Fourier aperture stop made of a material at least partially transparent to an applied beam of electromagnetic radiation. At least a part of a border of the Fourier aperture stop may be attached to an aperture and may deflect at least one order of diffraction of electromagnetic radiation into the material at least partially transparent to the applied beam of electromagnetic radiation.

Another example embodiment of the present invention provides a laser. The laser may include a pair of mirrors and an aperture stop assembly. The pair of spaced apart mirrors may form a resonant cavity for reflecting laser radiation, and the resonant cavity may have a region in which stimulated emission may take place. The aperture stop may be made of a material at least partially transparent to an applied electromagnetic radiation. At least a portion of a border of the aperture stop may be attached to an aperture to deflect electromagnetic radiation into the at least partially transparent material.

Example embodiments of the present invention may further include at least one beam dump receiving the electromagnetic radiation deflected by the aperture stop.

In example embodiments of the present invention, an aperture stop may stop the electromagnetic radiation at least partially in one dimension. In example embodiments of the present invention, the aperture stop may stop the electromagnetic radiation at least partially in two dimensions. In example embodiments of the present invention, the aperture stop may be comprised of at least one of glass, quarts, fused silica. In example embodiments of the present invention, the aperture stop may be at least partially coated with a layer of anti-reflection material. In example embodiments of the present invention, the aperture stop may be shaped to allow total internal reflection. In example embodiments of the present invention, the method may further include deflecting at least a part of said blocked beam of electromagnetic radiation to at least one beam dump.

Example embodiments of the present invention may further include at least one beam dump receiving the at least one order of diffraction of electromagnetic radiation deflected by the at least partially transparent Fourier aperture stop.

In example embodiments of the present invention, the Fourier aperture stop may stop the at least one order of diffraction of the electromagnetic radiation at least partially in one dimension. In example embodiments of the present invention, the Fourier aperture stop may stop at least one order of diffraction of the electromagnetic radiation at least partially in two dimensions. In example embodiments of the present invention, the Fourier aperture stop may be comprised of at least one of glass, quarts, fused silica. In example embodiments of the present invention, the Fourier aperture stop may be at least partially coated with a layer of anti-reflection material. In example embodiments of the present invention, an angle of the Fourier aperture stop may be chosen to allow total internal reflection. In example embodiments of the present invention, the Fourier aperture stop may be prism shaped.

In example embodiments of the present invention, the aperture stop assembly may be arranged within the resonant cavity. In example embodiments of the present invention, the aperture stop assembly may be arranged outside the resonant cavity.

DETAILED DESCRIPTION OF THE EXAMPLE EMBODIMENTS OF THE PRESENT INVENTION

The following detailed description is made with reference to the figures. Example embodiments are described to illustrate the present invention, not to limit its scope, which is defined by the claims. Those of ordinary skill in the art will recognize a variety of equivalent variations on the description that follows.

In the following, reference is made to optically transparent material. It should be understood, however, that the following description should not be limited to only optically transparent material. Those of ordinary skill in the art will recognize that the material chosen may depend on the applied radiation (e.g., electromagnetic radiation), that is, for example, the material to be used may be at least partly transparent to the applied radiation (e.g., electromagnetic radiation).

Figure 3:
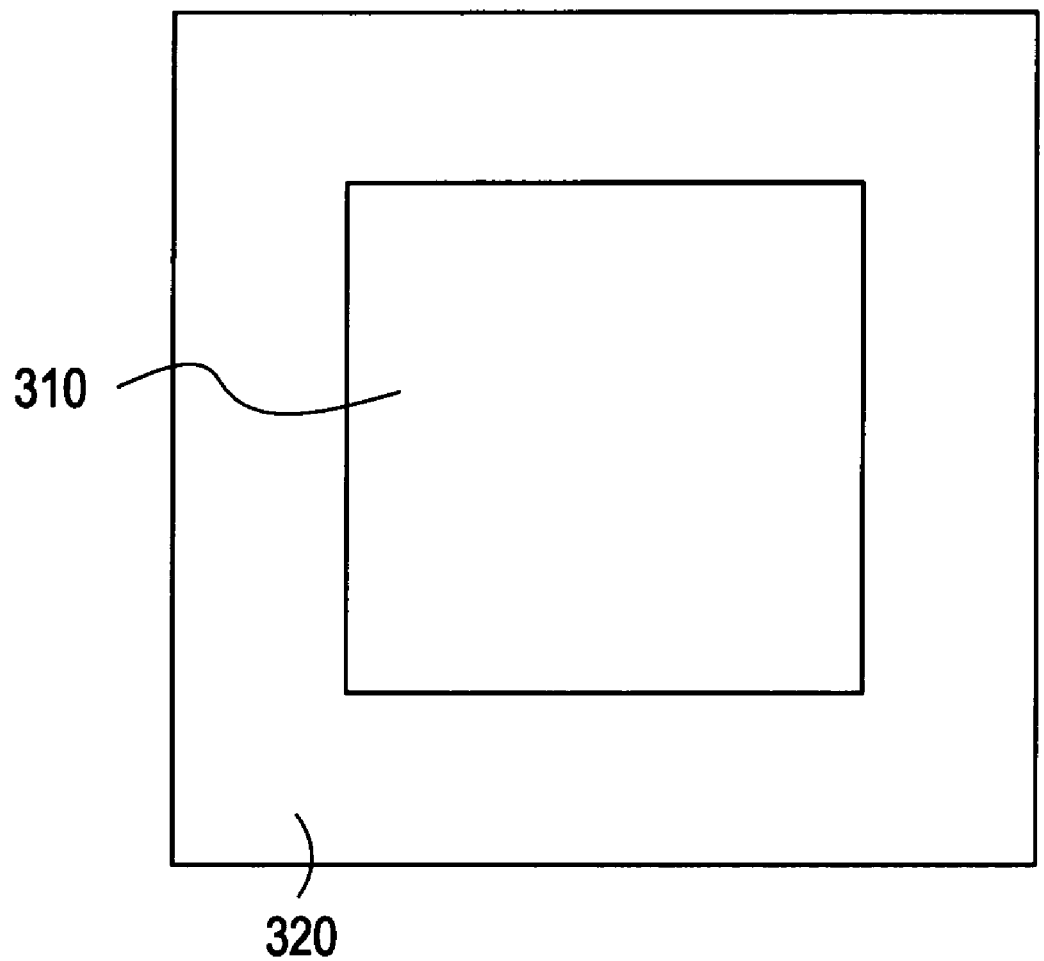
FIG. 3 depicts a top view of a conventional blocking aperture.

FIG. 3 illustrates a top view of a conventional (e.g., simple) blocking aperture 300. The conventional blocking aperture may include an aperture 310 and an aperture stop 320. The aperture stop 320 may be comprised of a material opaque to the applied electromagnetic radiation, for example a metal. The aperture 300 may be rectangular and may form a coherent radiation beam, which may originate from a source of radiation. The source of radiation may be, for example, an excimer laser.

Figure 2:
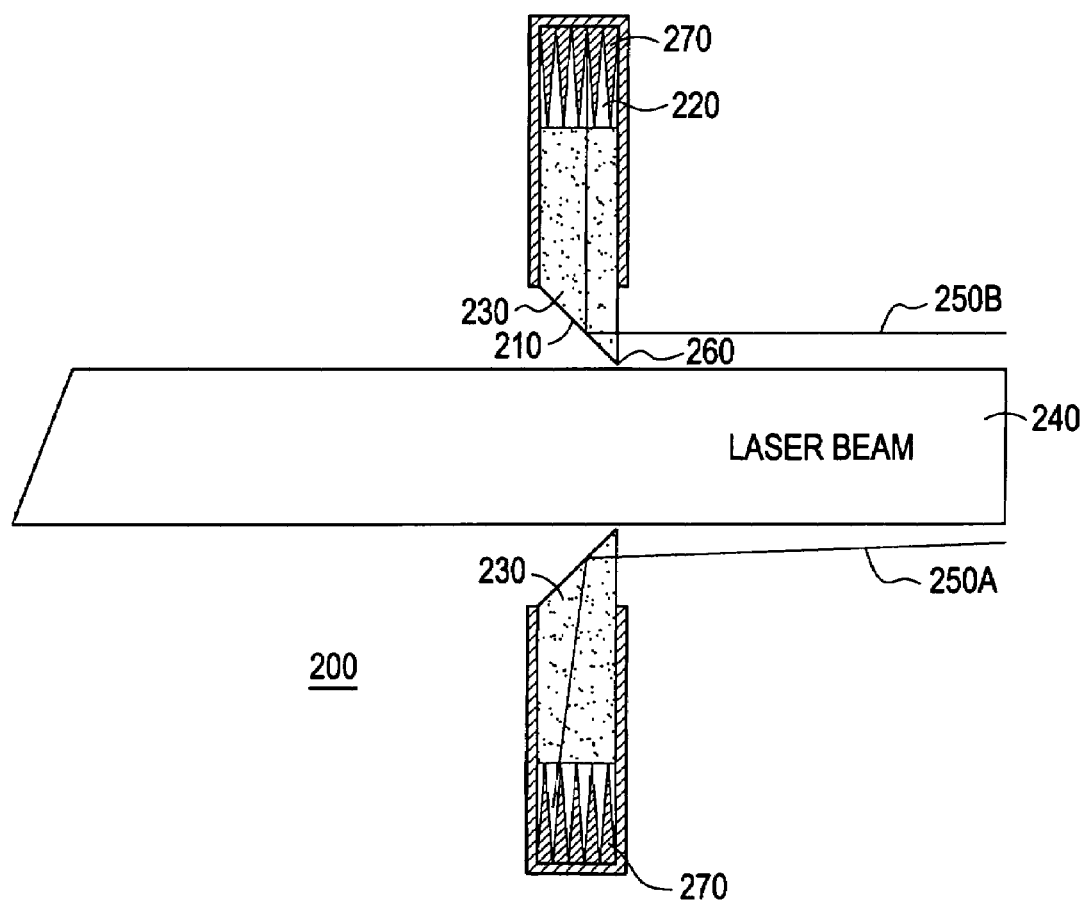
FIG. 2 depicts a cross-section of an aperture stop assembly, according to an example embodiment of the present invention.

FIG. 2 illustrates a cross section of an aperture stop assembly 200, according to an example embodiment of the present invention. The aperture stop assembly 200 includes at least partly transparent material (e.g., an optically transparent material) 230, an aperture stop 210, a beam dump 220, an aperture 260, and a housing 270.

An example embodiment of the aperture stop assembly 200 as illustrated in FIG. 2 may function as follows. A laser beam 240, 250a, 250b, which may be generated from the right side of FIG. 2, may impinge onto the aperture stop assembly 200. An inner part of the laser beam 240 may pass through the aperture 260 undisturbed. An outer part of said laser beam 250a, 250b may hit (e.g., collide with) an aperture stop 210, which may be formed as, for example, a prism. The prism, formed aperture stop 210, may be made of an at least partially transparent material (e.g., optically transparent material), for instance glass, quarts or fused silica or any other transparent (e.g., optically transparent) material. For example, the material chosen may depend on the wavelength used in the radiation (e.g., electromagnetic radiation) beam to be shaped and/or filtered by the aperture stop assembly 200. An angle of the prism formed aperture stop 210 may be chosen such that there may be total internal reflection, that is, such that the radiation beam is totally internally reflected. The angle may be, for example, 45 degrees or any other suitable angle of degree. Any design of the aperture stop may be used which allows for total internal reflection.

In a laser application, the thickness of the at least partially transparent material 230 may be, for example, 5–10 millimeters (mm). A length perpendicular from the beam may be adopted such that the beam dump 220 may have sufficient cooling space. The beam dump 220 and the remaining portions of the housing 270 may be made of metal or any suitable at least partially metallic material. An example of a beam dump 220 is a razor-blade stack, but any beam dump 220 capable of absorbing a sufficient percentage of the beam energy may be used. The beam dump 220 may be cooled using any gas, liquid, or combination thereof. The aperture 260 may take any form, for example, one or two dimensional. Examples of two-dimensional apertures 260 are circular, square, elliptic, star formed. However, the two-dimensional apertures 260 may be any suitable shape.

Since the material chosen for the aperture stop 210 may be at least partially transparent (e.g., optically transparent), there may be little (e.g., very little or no) absorption, and reduced heat deposition in the aperture stop 210. The aperture stop 210 may maintain form and/or shape, and the light may not be absorbed at the aperture stop 210. In FIG. 2, a portion of the radiation beam may be trapped in a beam dump 220 where the excess energy may be dissipated as, for example, heat. To reduce back reflections from the aperture stop 210, the aperture stop 210 may be at least partially coated with an anti-reflective layer. The aperture stop assembly 200 may be used for any kind of electromagnetic radiation using suitable materials.

The radiation source may be, as mentioned above, an excimer laser (or any other suitable laser) at any wavelength, for example, ultra-violet (UV), deep ultra-violet (DUV), extreme ultra-violet (EV), or any other suitable light. Example embodiments of the present invention may be used in pattern generators, metrology and/or inspection systems, which may use illumination (e.g., uniform illumination) by a laser (e.g., an excimer laser) or any other suitable electromagnetic radiation sources, which may have a defined shape.

The aperture stop assembly 200, according to an example embodiment of the present invention, could be used to shape any beam of electromagnetic radiation and/or may be used, for example, as a Fourier aperture assembly. If used as a Fourier aperture assembly, one or a plurality of diffraction orders may pass a Fourier aperture 260 and one or a plurality of diffraction orders may be blocked by a Fourier aperture stop 210.

Figure 1:
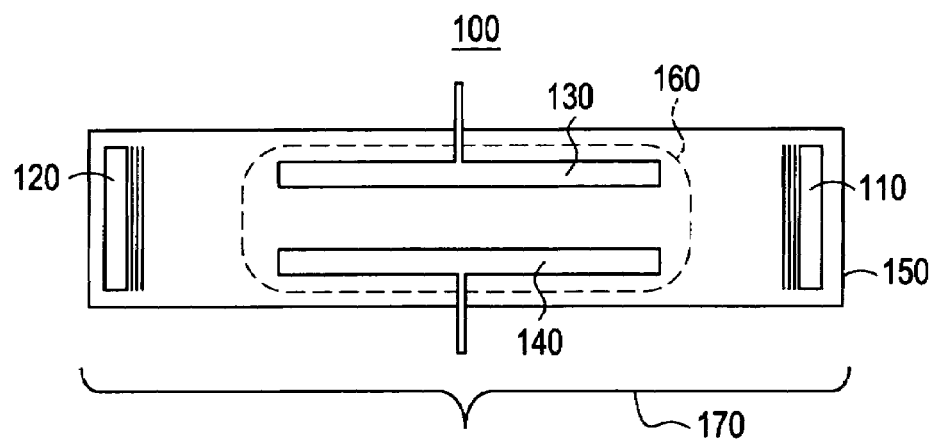
FIG. 1 depicts a side view of a conventional blocking aperture.

FIG. 1 illustrates an example of a conventional art transversally excited laser, for example, an excimer laser. The laser may comprise a first mirror 110 and a second mirror 120 forming a resonant cavity 170. The laser may further comprise a first electrode 130 and a second electrode 140 forming a discharge volume 160. A housing 150 may enclose the discharge volume 160 and the resonant cavity 170. One of the mirrors 110, 120 may be at least partially reflective and may allow a beam of radiation created within the resonant cavity to be emitted. The other mirror 110, 120 may be, for example, totally reflective. The housing 150 may be transparent to the emitted wavelength at an end where the at least partially reflective mirror may be arranged.

Example embodiments of the present invention have been discussed with respect to a prism. However, it will be understood that any suitable polygonal solid for dispersing light may be used in example embodiments of the present invention.

Example embodiments of the present invention, for example, the aperture assembly of FIG. 2, may be included in, or used in conjunction with, for example, any conventional laser or laser system. For example, the aperture stop assembly of FIG. 2 may be included in, or used in conjunction with, the conventional art transversally excited laser as illustrated in FIG. 1.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. An aperture stop assembly for use in a system, the assembly comprising:
   an aperture stop made of a material at least partially transparent to an applied electromagnetic radiation, wherein
      at least a part of a border of said aperture stop is attached to an aperture to deflect electromagnetic radiation into said transparent material, and
      said aperture stop is shaped to allow total internal reflection.

2. The aperture stop assembly according to claim 1, further including,
   at least one beam dump receiving the electromagnetic radiation deflected by said aperture stop.

3. The aperture stop according to claim 1, wherein said aperture stop stops said electromagnetic radiation at least partially in one dimension.

4. The aperture stop assembly according to claim 1, wherein said aperture stop stops said electromagnetic radiation at least partially in two dimensions.

5. The aperture stop assembly according to claim 1, wherein said aperture stop is comprised of at least one of glass, quarts, fused silica.

6. The aperture stop assembly according to claim 1, wherein said aperture stop is at least partially coated with a layer of anti-reflection material.

7. A laser comprising:
   a pair of spaced apart mirrors forming a resonant cavity for reflecting laser radiation; wherein
      said resonant cavity has a region in which stimulated emission takes place, and wherein
      said laser further includes an aperture stop assembly according to claim 1.

8. The laser according to claim 7, wherein said aperture stop assembly is arranged within the resonant cavity.

9. The laser according to claim 7, wherein said aperture stop assembly is arranged outside the resonant cavity.

10. A method for blocking at least a part of a beam of electromagnetic radiation, the method comprising:
    generating a beam of electromagnetic radiation;
    impinging said beam of electromagnetic radiation onto a beam aperture assembly;
    blocking at least a portion of said beam of electromagnetic radiation using a material at least partially transparent to the impinging beam of electromagnetic radiation; and
    defining an aperture stop, by deflecting said portion using at least one total internal reflection.

11. The method according to claim 10, further comprising the action of:
    deflecting at least a part of said blocked beam of electromagnetic radiation to at least one beam dump.

12. A Fourier filter assembly for use in an electromagnetic radiation system, the assembly comprising:
    a Fourier aperture stop made of a material at least partially transparent to an applied beam of electromagnetic radiation,
    at least a part of a border of said Fourier aperture stop is attached to an aperture and deflects at least one order of diffraction of electromagnetic radiation into said material at least partially transparent to the applied beam of electromagnetic radiation wherein,
    an angle of said Fourier aperture stop is chosen to allow total internal reflection.

13. The Fourier filter assembly according to claim 12, further comprising:
    at least one beam dump receiving the at least one order of diffraction of electromagnetic radiation deflected by said at least partially transparent Fourier aperture stop.

14. The Fourier filter assembly according to claim 12, wherein said Fourier aperture stop stops said at least one order of diffraction of said electromagnetic radiation at least partially in one dimension.

15. The Fourier filter assembly according to claim 12, wherein said Fourier aperture stop stops at least one order of diffraction of said electromagnetic radiation at least partially in two dimensions.

16. The Fourier filter assembly according to claim 12, wherein said Fourier aperture stop comprises at least one of glass, quarts, fused silica.

17. The Fourier filter assembly according to claim 12, wherein said Fourier aperture stop is at least partially coated with a layer of anti-reflection material.

18. The Fourier filter assembly according to claim 12, wherein said Fourier aperture stop is prism shaped.

* * * * *